(12) United States Patent
Shin et al.

(10) Patent No.: US 8,929,693 B2
(45) Date of Patent: Jan. 6, 2015

(54) SEMICONDUCTOR PACKAGE AND SEMICONDUCTOR DEVICE INCLUDING THE SAME

(71) Applicant: Samsung Electronics Co., Ltd., Suwon-si (KR)

(72) Inventors: Dong-jae Shin, Seoul (KR); Hyun-il Byun, Seongnam-si (KR); Kwang-hyun Lee, Hwaseong-si (KR); Kwan-sik Cho, Hwaseong-si (KR); Ho-chul Ji, Yongin-si (KR); Jung-hyung Pyo, Seoul (KR); Kyoung-ho Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 13/787,918

(22) Filed: Mar. 7, 2013

(65) Prior Publication Data

US 2013/0330035 A1    Dec. 12, 2013

(30) Foreign Application Priority Data

Jun. 7, 2012   (KR) .......................... 10-2012-0061077

(51) Int. Cl.
*G02B 6/12* (2006.01)
*G02B 6/42* (2006.01)
*G02B 6/43* (2006.01)

(52) U.S. Cl.
CPC ................ *G02B 6/12* (2013.01); *G02B 6/4207* (2013.01); *G02B 6/4214* (2013.01); *G02B 6/428* (2013.01); *G02B 6/43* (2013.01)
USPC ................... 385/14; 385/15; 385/31; 385/33; 385/37; 385/123

(58) Field of Classification Search
CPC .......... G02B 6/43; G02B 6/4214; G02B 6/42; G02B 6/13; G02B 6/12
USPC ............................ 385/14, 15, 31, 33, 37, 123
See application file for complete search history.

(56) References Cited

U.S. PATENT DOCUMENTS

| | | | |
|---|---|---|---|
| 6,512,861 B2 | 1/2003 | Chakravorty et al. | |
| 6,754,407 B2 | 6/2004 | Chakravorty et al. | |
| 7,039,263 B2 | 5/2006 | Towle | |
| 7,049,704 B2 | 5/2006 | Chakravorty et al. | |
| 7,092,603 B2 | 8/2006 | Glebov et al. | |
| 7,561,762 B2 * | 7/2009 | Miyoshi et al. | 385/14 |
| 7,783,143 B2 * | 8/2010 | Miyoshi et al. | 385/14 |
| 2004/0057648 A1 | 3/2004 | Yunus | |
| 2005/0111781 A1 | 5/2005 | Jain et al. | |

FOREIGN PATENT DOCUMENTS

| | | |
|---|---|---|
| JP | 11-183761 | 7/1999 |
| JP | 2004-012889 | 1/2004 |
| JP | 2008-216712 | 9/2008 |

* cited by examiner

*Primary Examiner* — Jennifer Doan
(74) *Attorney, Agent, or Firm* — Myers Bigel Sibley & Sajovec, P.A.

(57) ABSTRACT

A semiconductor package and a semiconductor device including the same. The semiconductor package includes: a package substrate; a plurality of connection elements that are disposed on the package substrate; and a semiconductor chip that includes at least one optical input/output element that transmits/receives an optical signal to/from the outside at an optical input/output angle with respect to a direction perpendicular to a bottom surface of the package substrate, and is electrically connected to the package substrate through the plurality of connection.

20 Claims, 15 Drawing Sheets

SEMICONDUCTOR PACKAGE AND SEMICONDUCTOR DEVICE INCLUDING THE SAME

CROSS-REFERENCE TO RELATED APPLICATION

This application claims the benefit under 35 U.S.C. §119 of Korean Patent Application No. 10-2012-0061077, filed on Jun. 7, 2012 in the Korean Intellectual Property Office, the disclosure of which is incorporated herein in its entirety by reference.

BACKGROUND

The inventive concept relates to a semiconductor device, and more particularly, to a semiconductor package and a semiconductor device including the same.

As technology related to electronic devices has been developed, demand for smaller and higher speed electronic devices has increased, and thus, semiconductor packages included in electronic devices are desired that transmit signals at higher speeds.

SUMMARY

The inventive concept provides a semiconductor package which may improve optical input/output efficiency and reduce reflected light when an optical signal is transmitted/received to/from the outside of a semiconductor chip through an optical input/output element.

The inventive concept also provides a semiconductor device which may improve optical input/output efficiency and reduce reflected light when an optical signal is transmitted/received to/from the outside of a semiconductor chip through an optical input/output element.

According to an aspect of the inventive concept, there is provided a semiconductor package including: a package substrate; a plurality of connection elements that are disposed on the package substrate; and a semiconductor chip that is electrically connected to the package substrate through the plurality of connection elements, the semiconductor chip including at least one optical input/output element that is configured to pass an optical signal between the semiconductor chip and en element external to the package substrate at an optical input/output angle that is substantially different from a direction perpendicular to a bottom surface of the package substrate.

A bottom surface of the semiconductor chip may be inclined by the optical input/output angle with respect to the bottom surface of the package substrate.

The plurality of connection elements may have different heights. The heights of the plurality of connection elements may gradually increase in one direction.

The plurality of connection elements may include at least one of bumps having different heights and solder balls having different ball sizes.

A top surface of the package substrate may be inclined by the optical input/output angle with respect to the bottom surface of the package substrate.

The semiconductor package may further include a microlens that is disposed under the at least optical input/output element that is configured to adjust the optical input/output angle.

The optical input/output angle may be between from about 6 degrees to about 10 degrees.

The at least one optical input/output element may be a grating coupler.

According to another aspect of the inventive concept, there is provided a semiconductor device including: a printed circuit board (PCB) that includes an optical waveguide and a reflector connected to one end of the optical waveguide, the reflector having a curved reflective surface; and a semiconductor package that is disposed on a surface of the PCB and includes a semiconductor chip that includes at least one optical input/output element that may transmit an optical signal to the optical waveguide or receive an optical signal from the optical waveguide at an optical input/output angle with respect to a direction perpendicular to the PCB.

In some embodiments, the reflector may be inclined by an angle ranging from about 40 degrees to about 42 degrees from a bottom surface of the optical waveguide. In other embodiments, the reflector may be inclined by an angle of about 45 degrees from a bottom surface of the optical waveguide.

The semiconductor chip may be inclined by the optical input/output angle with respect to a major surface of the PCB.

The semiconductor package may further include a microlens that is disposed under the at least one optical input/output element and adjusts the optical input/output angle.

The at least one optical input/output element may be a grating coupler.

According to another aspect of the inventive concept, a semiconductor device includes a printed circuit board that comprises an optical waveguide and a reflector connected to one end of the optical waveguide; and a semiconductor package that includes a semiconductor chip that has an optical input/output element that is configured to be in optical communication with the optical waveguide, wherein the optical input/output element is configured to transmit light at an optical input/output angle that is inclined between about 6 degrees and about 10 degrees with respect to a direction that is perpendicular to a bottom surface of the semiconductor chip.

The optical input/output element may be a grating coupler

The bottom surface of the optical waveguide may define a first plane and a bottom surface of the semiconductor chip may define a second plane that is parallel to the first plane.

The bottom surface of the optical waveguide may define a first plane and a bottom surface of the semiconductor chip may define a second plane that is inclined between about 6 degrees and about 10 degrees with respect to the first plane.

The bottom surface of the optical waveguide may define a first plane and a bottom surface of the semiconductor chip may define a second plane that is parallel to the first plane, and an optical focusing element may be interposed in the optical transmission path between the optical waveguide and the optical input/output element such that an optical signal passing from the optical input/output element to the optical waveguide passes through the optical focusing element in an off-axis manner.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
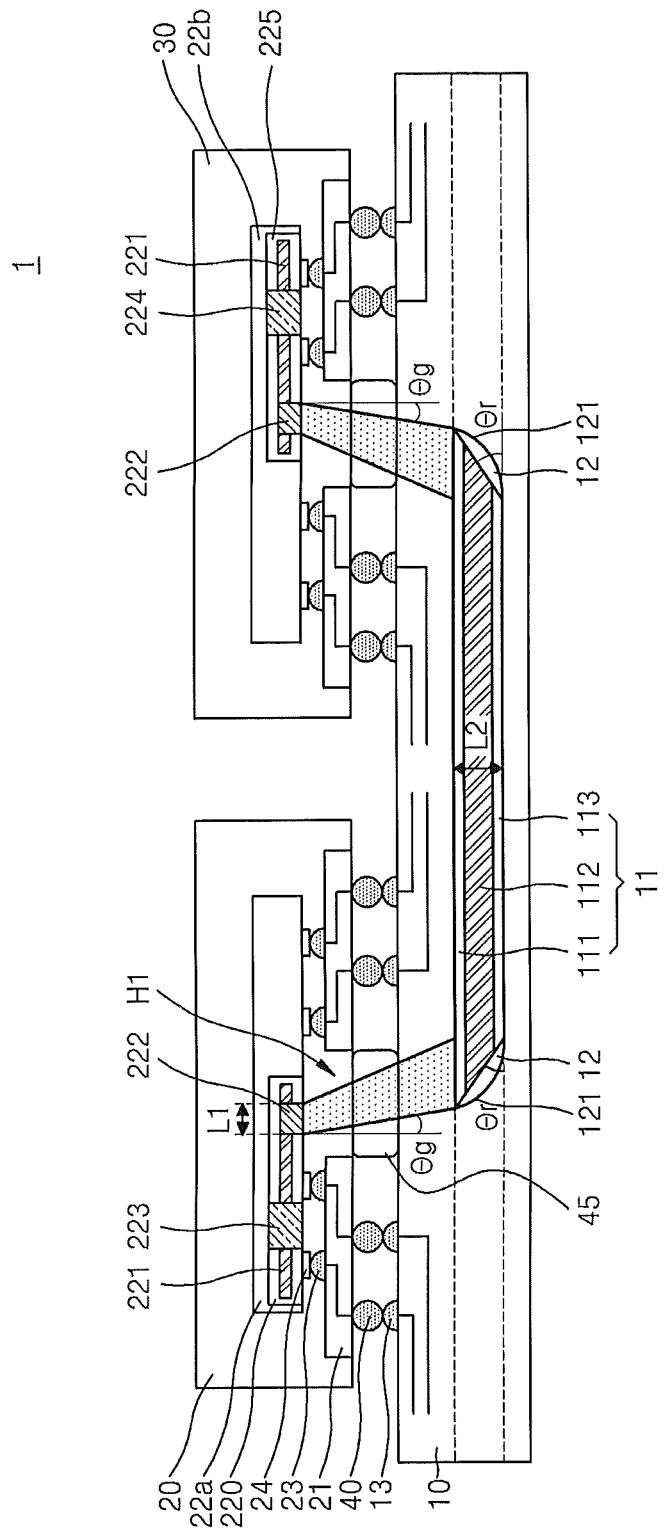
FIG. 1 is a cross-sectional view illustrating a semiconductor device according to an embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

The inventive concept now will be described more fully hereinafter with reference to the accompanying drawings, in which elements of the inventive concept are shown. The inventive concept may, however, be embodied in many different forms and should not be construed as limited to the example embodiments set forth herein. Rather, these embodiments are provided so that this disclosure will be thorough and complete, and will fully convey the scope of the inventive concept to one of ordinary skill in the art.

It will be understood that when a layer is referred to as being "on" another layer or a substrate, it can be directly on the other layer or the substrate, or intervening layers may also exist therebetween. Thicknesses or sizes of layers shown in the drawings are exaggerated for clarity, and the same reference numerals denote the same constituent elements.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises," "comprising, "includes" and/or "including" used herein specify the presence of stated features, integers, steps, operations, members, components, and/or groups thereof, but do not preclude the presence or addition of one or more other features, integers, steps, operations, members, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the example embodiments.

Example embodiments are described herein with reference to illustrations that are schematic illustrations of these embodiments. As such, variations from the shapes of the illustrations as a result, for example, of manufacturing techniques and/or tolerances, are to be expected. Thus, the embodiments discussed herein should not be construed as limited to the particular shapes of regions illustrated but may also include deviations in shapes that result, for example, from manufacturing. Also, in the attached drawings, the same reference numerals denote the same constituent elements.

Figure 2:
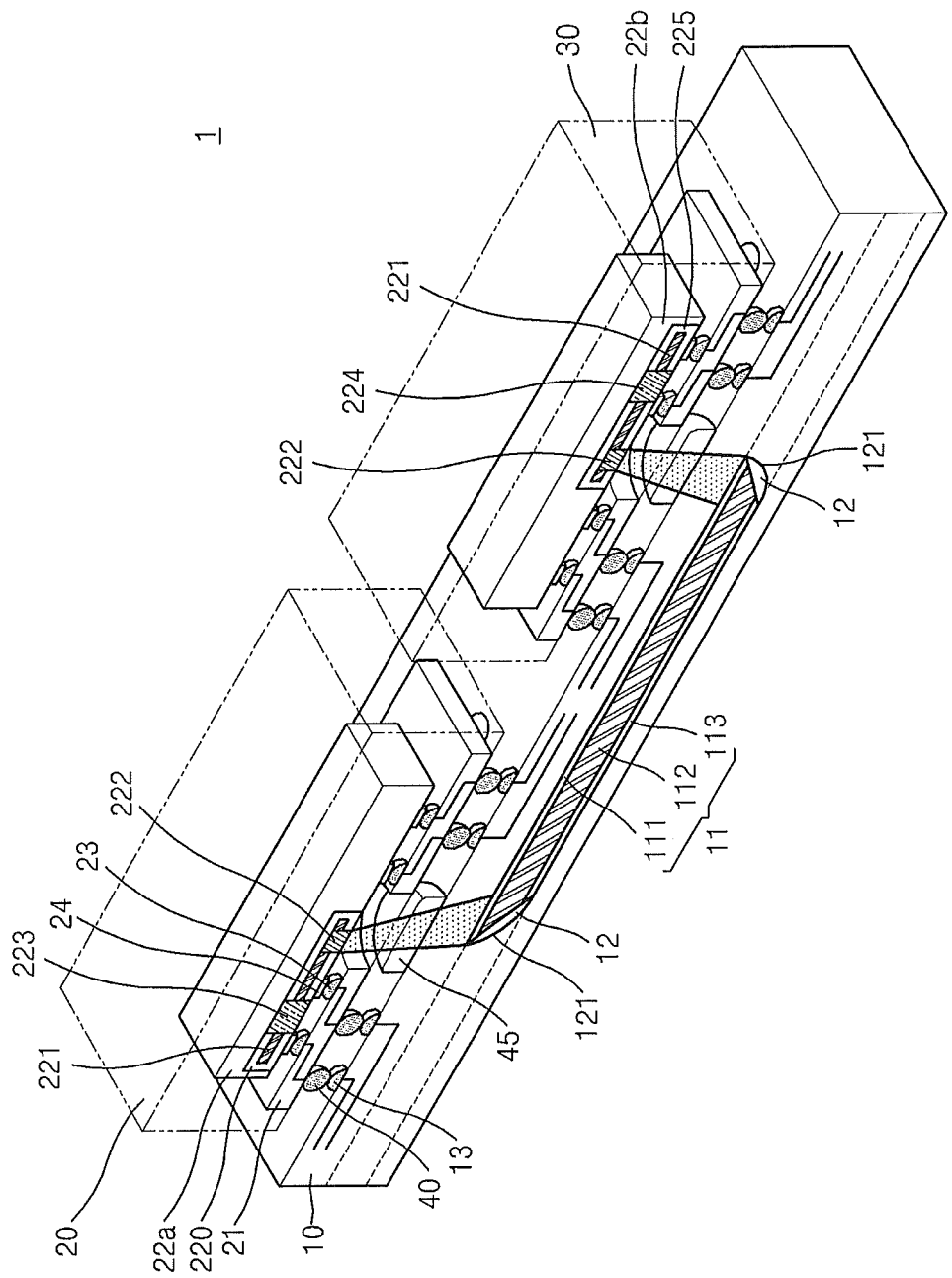
FIG. 2 is a perspective view of the semiconductor device of FIG. 1.

FIG. 1 is a cross-sectional view illustrating a semiconductor device 1 according to an embodiment of the inventive concept. FIG. 2 is a perspective view of the semiconductor device 1 of FIG. 1.

Referring to FIGS. 1 and 2, the semiconductor device 1 may include a printed circuit board (PCB) 10 and a plurality of semiconductor packages, for example, first and second semiconductor packages 20 and 30, disposed on the PCB 10. The first and second semiconductor packages 20 and 30 may be mounted on the PCB 10 through a plurality of connection elements 40 and 13 that electrically connect the first and second semiconductor packages 20 and 30 to the PCB 10. The PCB 10 may serve as a mother PCB or a main PCB. Although only the first and second semiconductor packages 20 and 30 are disposed on the PCB 10 in FIG. 1, the present embodiment is not limited thereto, and three or more semiconductor packages may be disposed on the PCB 10.

The PCB 10 may include a waveguide 11 that is embedded in the PCB 10 and one or more reflectors 12. Light may be transmitted through the waveguide 11, and in this case, the PCB 10 may be an optical PCB. The waveguide 11 and the reflector 12 will now be explained in detail.

The waveguide 11 may include an upper cladding layer 111, a core layer 112, and a lower cladding layer 113. The core layer 112 may include a dielectric material having a relatively high refractive index, and the upper and lower cladding layers 111 and 113 may include a dielectric material having a relatively low refractive index. For example, the core layer 112 may include silicon (Si), and the upper and lower cladding layers 111 and 113 may include silicon oxide (SiO$_2$). A difference between refractive indices of the silicon and the silicon oxide may be, for example, about 2.0.

Since the core layer 112 is surrounded by the upper and lower cladding layers 111 and 113, light may be confined within the core layer 112 without being radiated outside the waveguide 11 due to total internal reflection. Light may be more tightly confined within the waveguide 11 by increasing a difference between refractive indices of the core layer 112 and the upper and lower cladding layers 111 and 113, thereby improving the light guiding efficiency of the waveguide 11.

Figure 3A:
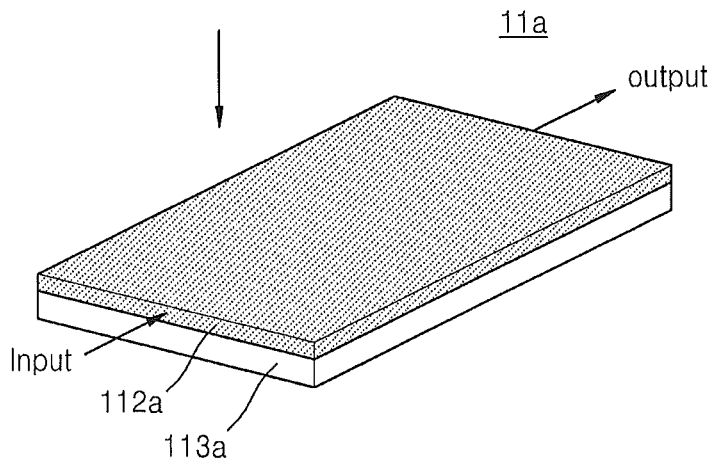
FIGS. 3A through 3C are perspective views illustrating various examples of a waveguide included in the semiconductor device of FIG. 1.
Figure 3B:
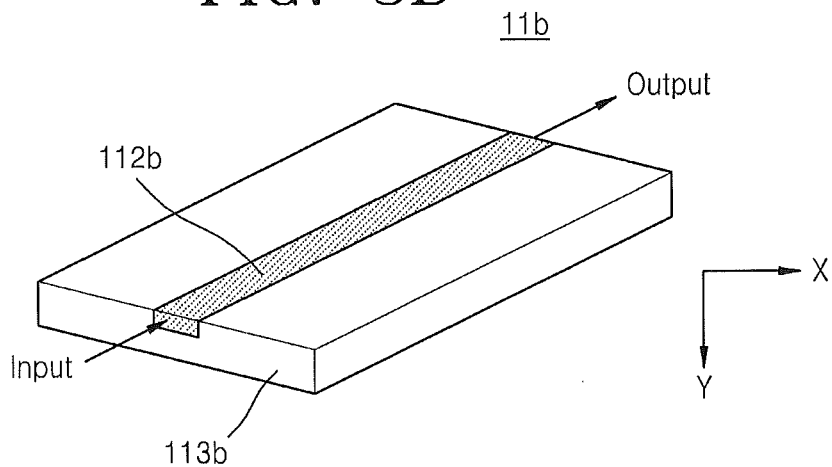
Figure 3C:
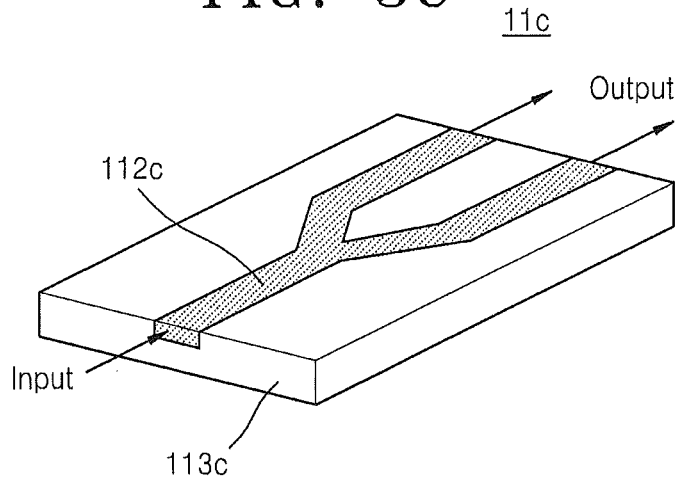

FIGS. 3A through 3C are perspective views illustrating various example embodiments of the waveguide 11 that is included in the semiconductor device 1 of FIGS. 1 and 2.

Referring to FIG. 3A, a waveguide 11a may include (but is not limited to) a lower cladding layer 113a and a core layer 112a. The core layer 112a has a one-dimensional flat slab shape and is disposed on the lower cladding layer 113a. The waveguide 11a may use an air layer as an upper cladding layer. In this case, since a refractive index changes only in a depth direction indicated by an arrow, an optical signal passing through the waveguide 11a is refracted only in the depth direction.

Referring to FIG. 3B, a waveguide 11b may include (but is not limited to) a lower cladding layer 113b and a core layer 112b that has a channel shape and that is disposed in the lower cladding layer 113b. The waveguide 11b may use an air layer as an upper cladding layer. In this case, a refractive index changes in a depth direction Y and a width direction X of the channel shape.

Referring to FIG. 3C, a waveguide 11c may include (but is not limited to) a lower cladding layer 113c and a core layer 112c. The core layer 112c has a branched channel shape and is disposed in the lower cladding layer 113c. The waveguide 11c may use an air layer as an upper cladding layer. In this case, the waveguide 11c may split an optical signal into two optical signals.

Referring back to FIG. 1, reflectors 12 may be disposed on both ends of the waveguide 11 and each reflector 12 may reflect an optical signal that is transmitted through the waveguide 11. The waveguide 11 may extend toward a rear surface of the reflector 12, that is, in a direction indicated by a dashed line, and an optical signal transmitted through the waveguide 11 may be at least partially reflected by the reflector 12 and may be partially transmitted into the extended waveguide 11.

Each reflector 12 may be inclined by a first angle θr from a plane defined by a bottom surface of the waveguide 11, that is, a bottom surface of the lower cladding layer 113. In the present embodiment, the first angle θr may range from about 40 degrees to about 42 degrees. Also, each reflector 12 may have a curved rear reflective surface 121 and may be formed of glass, a polymer, or the like. A structure and effect of the reflectors 12 will be explained below in detail after describing the first and second semiconductor packages 20 and 30.

The first semiconductor package 20 may include a package substrate 21, a semiconductor chip 22a, a plurality of connection elements 23, and a plurality of connection pads 24. The second semiconductor package 30 may include the package substrate 21, a semiconductor chip 22b, the plurality of connection elements 23, and the plurality of connection pads 24. As such, the first and second semiconductor packages 20 and 30 may have substantially the same constituent elements except that they may have different semiconductor chips 22a and 22b.

Since the package substrates 21 support the respective semiconductor chips 22a and 22b, the package substrates 21 may act as support substrates. In the present embodiment, each package substrate 21 may be a PCB. Each package substrate 21 may have a plate shape having a central portion in which an opening H1 is formed. Accordingly, an optical signal may be easily transmitted/received through a grating coupler 222a (which will be explained below) that is used as an optical input/output element 222. However, the present embodiment is not limited thereto, and the package substrate 21 may have a plate shape having a portion, other than the central portion, in which the opening H1 may be formed. A size of the opening H1 may be determined, for example, by considering a size L1 of the grating coupler 222a and a size L2 of the waveguide 11. The opening H1 may have any appropriate cross-sectional shape such as, for example, a circular shape or a polygonal shape.

The plurality of connection elements 23 may be disposed on the package substrate 21, and each of the semiconductor chips 22a and 22b may be electrically connected to the package substrate 21 through the connection elements 23. In detail, the plurality of connection pads 24 may be disposed on a bottom surface of each of the semiconductor chips 22a and 22b. Since the plurality of connection pads 24 and the plurality of connection elements 23 are connected to each other, each of the semiconductor chips 22a and 22b may be electrically connected to the package substrate 21.

The first semiconductor chip 22a may include a first integrated circuit (IC) 220, and the second semiconductor chip 22b may include a second IC 225. The first IC 220 may include a waveguide 221, an optical input/output element 222, and a modulator 223, and the second IC 225 may include the waveguide 221, the optical input/output element 222, and a photodiode 224.

Since each of the first and second ICs 220 and 225 includes optical elements such as the waveguide 221, the optical input/output element 222, and the modulator 223 or the photodiode 224, the first and second ICs 220 and 225 may be optical ICs. Although not shown in FIG. 1, the first and second ICs 220 and 225 may further include other optical elements such as a light source, a filter, and a multiplexer. In addition, the first or second IC 220 or 225 may further include electrical elements. Herein, an IC including optical elements and electrical elements may be referred to as an optoelectronic IC.

The waveguides 221 may be formed in a similar manner to that used to form the waveguide 111 that is embedded in the PCB 10, and thus, a detailed description thereof will not be given. Also, although a core layer and upper and lower cladding layers of the waveguides 221 are not separately shown in FIG. 1, the description of the waveguide 11 embedded in the PCB 10 may apply to the waveguides 221.

The optical input/output element 222 may be used to extract an optical signal that is transmitted through the waveguide 221 and pass the optical signal to outside the waveguide 221, that is, to the waveguide 11 embedded in the PCB 10. Alternatively, the optical input/output element 222 may receive an optical signal from an external source, that is, from the waveguide 11 embedded in the PCB 10, and then inject the optical signal into the waveguide 221. The optical input/output element 222 may serve as an optical coupling element or a coupling element. For example, the optical input/output element 222 may include the grating coupler 222a. The grating coupler 222a will now be explained in detail with reference to FIGS. 4 and 5.

Figure 4:
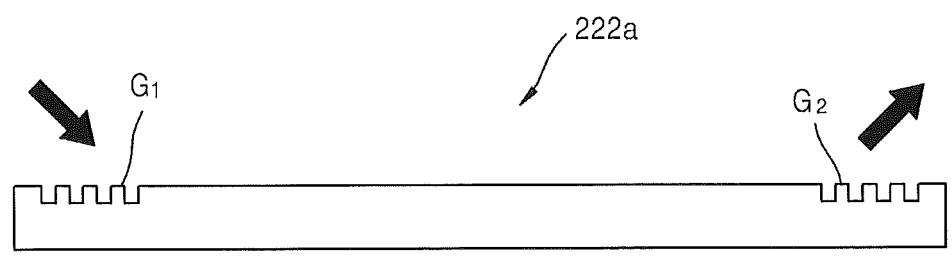
FIG. 4 is a cross-sectional view illustrating a grating coupler included in the semiconductor device of FIG. 1.

FIG. 4 is a cross-sectional view illustrating an example of the grating coupler 222a that may be used to implement the optical input/output element 222 that is included in the semiconductor device 1 of FIG. 1.

Referring to FIG. 4, the grating coupler 222a may be embodied by forming a plurality of gratings, for example, gratings G1 and G2, on one end of the waveguide 221. The grating coupler 222a may transmit/receive light by using the fact that light is diffracted around the gratings G1 and G2, and may filter light by adjusting a distance between the gratings G1 and G2.

A size of each of the gratings G1 and G2, that is, a period of each of the gratings G1 and G2, formed on the grating coupler 222a may be determined by a width w of light incident on the grating coupler 222a or a k-vector. Accordingly, since the gratings G1 and G2 are appropriately formed on the grating coupler 222a, light incident on the grating coupler 222a may be coupled with high optical coupling efficiency to the grating coupler 222a. Conditions under which light is coupled to the grating coupler 222a will now be explained with reference to FIG. 5.

Figure 5:
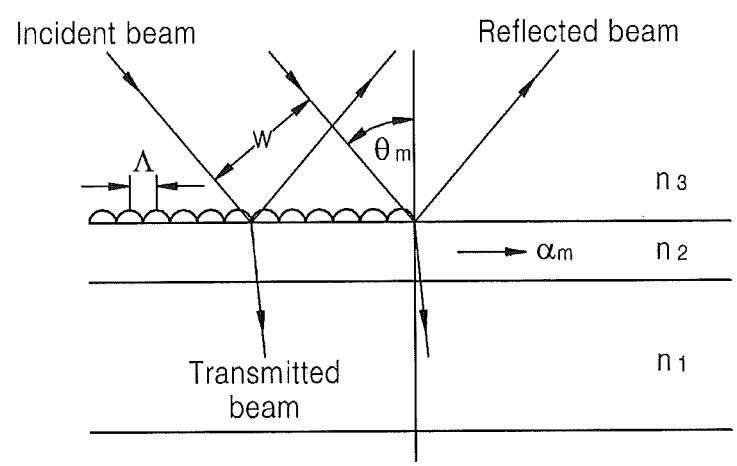
FIG. 5 is a cross-sectional view for explaining optical coupling through the grating coupler of FIG. 4.

FIG. 5 is a cross-sectional view for explaining optical coupling through the grating coupler 222a of FIG. 4.

Referring to FIG. 5, in order for light incident on the grating coupler 222a to be coupled with high optical coupling efficiency to the grating coupler 222a, phases of the light and the grating coupler 222a have to be the same. Such a phase matching condition may be defined by using Equation 1.

$$\beta_v = \beta_0 + v2\pi/\Lambda \quad (1)$$

In Equation 1, v is an integer, $\Lambda$ denotes a grating period, $\beta_v$ denotes a phase in a with mode, and $\beta_0$ denotes a phase in a fundamental mode.

Also, a guiding condition, which is a condition for confining incident light to the waveguide 221, may be defined by using Equation 2.

$$\alpha_m = \kappa n_3 \sin \theta_m = (2\pi/\lambda 0 n_3) \sin \theta_m \quad (2)$$

In Equation 2, m is an integer, $\lambda 0$ denotes a wavelength of the light in the fundamental mode, k is a k-vector which is a reciprocal of the wavelength, $\alpha_m$ denotes a refractive index condition value of the light in an mth mode, and $\theta_m$ denotes an incident angle of the light in the mth mode.

In FIG. 5, w denotes a width of incident light, $n_1$ denotes a refractive index of a lower cladding layer, $n_2$ denotes a refractive index of a core layer, and $n_3$ denotes a refractive index of an upper cladding layer or the outside of the waveguide 221. In order to guide the light to the waveguide 221, $\kappa n_3 < \alpha_m < \kappa n_2$ has to be satisfied.

Referring back to FIG. 1, the modulator 223 may modulate an electrical signal received from the outside (e.g., from the waveguide 11) into an optical signal, and the optical input/output element 222 may transmit an optical signal that is generated by the modulator 223 to the outside. In this case, the first semiconductor chip 22a may be used as a transmitter and the second semiconductor chip 22b may be used as a receiver. The photodiode 224 may detect the optical signal received from the optical input/output element 222 and generate an electrical signal. It will be appreciated that in other embodiments the second semiconductor chip 22b may be used as a transmitter receiver and the first semiconductor chip 22a may be used as a receiver or that both of the semiconductor chips 22a and 22b may be used as both a transmitter and a receiver.

For example, the first semiconductor chip 22a may be a central processing unit (CPU), and the second semiconductor chip 22b may be a memory device. In this case, the second semiconductor chip 22b may further include a plurality of memory cells (not shown). Alternatively, both the first and second semiconductor chips 22a and 22b may be memory devices, and in this case, each of the first and second semiconductor chips 22a and 22b may further include a plurality of memory cells. Alternatively, the first semiconductor chip 22a may be a CPU and the second semiconductor chip 22b may be a hub, and in this case, the second semiconductor chip 22b may be connected to a plurality of memory devices (not shown).

In a conventional method, a semiconductor package is formed by individually manufacturing optical elements and then assembling the optical elements on a PCB, and a vertical-cavity surface-emitting laser (VCSEL) or a photodiode is used as an optical input/output element for transmitting/receiving an optical signal to/from the outside of the semiconductor package. However, in the present embodiment, individual optical elements such as the modulator 223 and the photodiode 224 are formed in the first and second ICs 220 and 225 and are connected through the waveguides 221 in the first and second ICs 220 and 225, and the grating coupler 222a is used as an optical input/output element 222 for inputting/outputting an optical signal transmitted through the optical elements to/from the outside.

When an optical signal is perpendicularly input/output to/from the grating coupler 222a, reflected light may be generated, and thus, optical signal transmission efficiency may be reduced. Accordingly, in order to improve optical signal transmission efficiency, the semiconductor packages 20 and 30 or the PCB 10 may be configured such that the optical signal is input/output to/from the grating coupler 222a at a second angle θg. The second angle θg may be, for example, about 8 degrees, from a direction perpendicular to the a major surface of the PCB 10 (herein the "perpendicular direction"). In this case, the second angle θg may be defined as an 'optical input/output angle.'

In the present embodiment, the reflectors 12 may be inclined by a first angle θr from the bottom surface of the waveguide 11, and the first angle θr may range from about 40 degrees to about 42 degrees. Accordingly, an optical signal transmitted through the waveguide 11 may not be reflected in the perpendicular direction, but instead may be transmitted to the grating coupler 222a at an inclination of about 6 degrees to about 10 degrees from the perpendicular direction. Also, an optical signal output from the grating coupler 222a may be transmitted to the waveguide 11 at an inclination of about 6 degrees to about 10 degrees from the perpendicular direction. Accordingly, the optical input/output angle, that is, the second angle θg, may be designed to range from about 6 degrees to about 10 degrees. In detail, when the first angle θr is 40 degrees, the second angle θg may be 10 degrees, when the first angle θr is 41 degrees, the second angle θg may be 8 degrees, and when the first angle θr is 42 degrees, the second angle θg may be 6 degrees. The regions of the optical waveguide adjacent the reflectors 12 comprise optical signal injection/extraction regions of the optical waveguide as an optical signal may be input to the optical waveguide or extracted from the optical waveguide at these regions.

Also, the size L1 of the grating coupler 222a may be less than the size L2 of the waveguide 11, that is, a width of the waveguide 11. For example, the size L1 of the grating coupler 222a may be about 10 μm and the size L2 of the waveguide 11 may be about 50 μm. Accordingly, it may be easy to transmit an optical signal from the grating coupler 222a to the waveguide 11, whereas it may be difficult to transmit an optical signal from the waveguide 11 to the grating coupler 222a. In detail, the grating coupler 222a may not receive all optical signals transmitted from the waveguide 11 since the waveguide 11 outputs a light field having a surface area that exceeds the surface area of the grating coupler 222a. This results in reduced optical coupling efficiency. In order to solve this problem, an optical signal transmitted from the waveguide 11 may be collected and transmitted to the grating coupler 222a by additionally providing an optical system (for example, a lens system) on the semiconductor device 1.

According to the present embodiment, since the reflectors 12 each have a curved reflective surface 121, an optical signal transmitted along the waveguide 11 may be collected on the curved reflective surface 121. Next, the optical signal collected on the reflective surface 121 may be transmitted to the grating coupler 222a with a width suitable for the size L1 of the grating coupler 222a (i.e., the curved reflective surface 121 focuses the light received from the waveguide 11). Hence, optical coupling efficiency between the waveguide 11 and the grating coupler 222a may be improved. In this case, since an optical system for optical coupling is not required to be additionally provided between the grating coupler 222a and the waveguide 11, costs may be reduced and mass production may be facilitated.

A refractive index matching unit 45 may be disposed between the opening H1 and the PCB 10, and may be formed by applying a liquid or an adhesive having almost the same refractive index as that of a material of each of the PCB 10 and any material in the opening H1. Accordingly, optical signal loss between the waveguide 11 embedded in the PCB 10 and the grating coupler 222a may be reduced.

As described above, since an optical signal may be transmitted through the waveguides 221 in the first and second semiconductor packages 20 and 30, and an electrical signal may be transmitted through wiring by using the plurality of connection elements 23 and the plurality of connection pads 24, each of the first and second semiconductor packages 20 and 30 may be called an optoelectronic semiconductor package. However, the present embodiment is not limited thereto, and each of the first and second semiconductor packages 20 and 30 may be an optical semiconductor package in which all data is transmitted/received as an optical signal. Even in this case, power may be supplied as an electrical signal to the first and second semiconductor packages 20 and 30 through the wiring.

Figure 6:
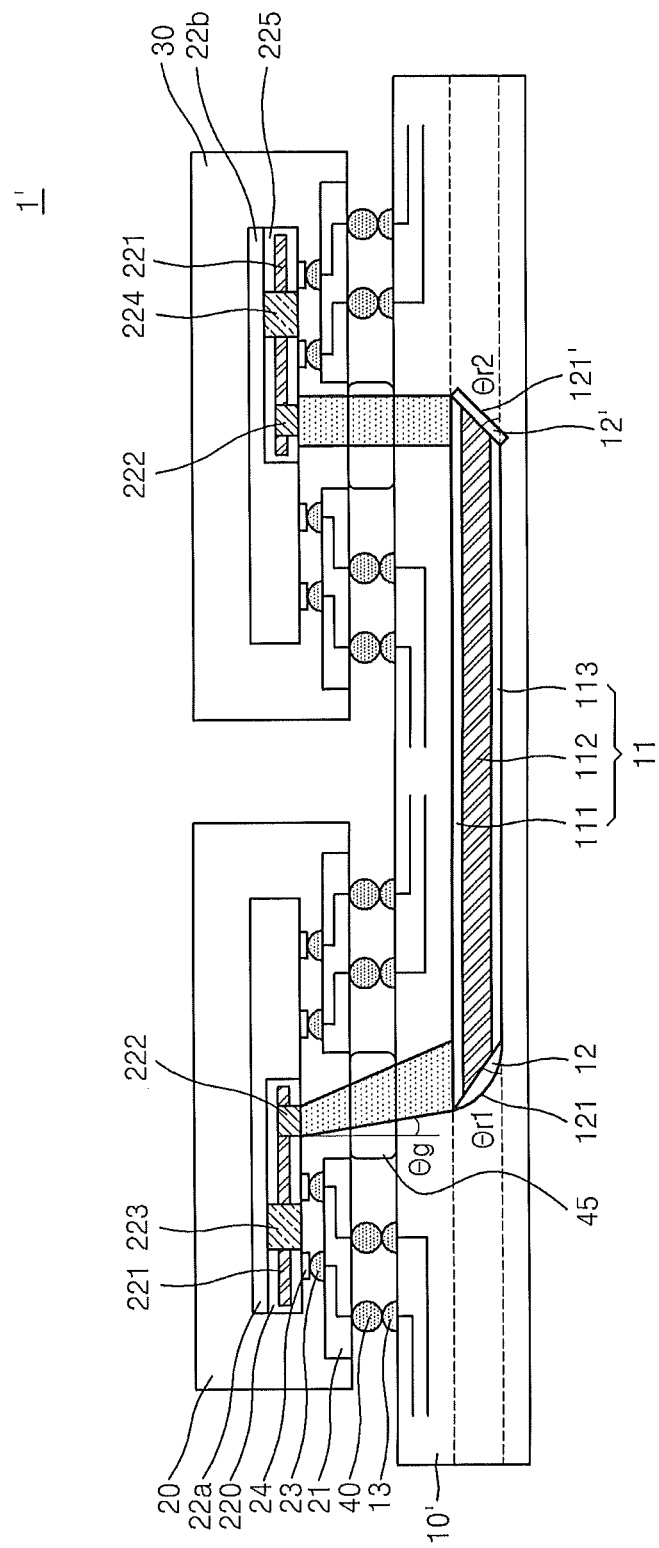
FIG. 6 is a cross-sectional view illustrating a modified example of the semiconductor device of FIG. 1.

FIG. 6 is a cross-sectional view illustrating a modified example of the semiconductor device 1 of FIG. 1.

Referring to FIG. 6, a semiconductor device 1' may include a PCB 10' and the first and second semiconductor packages 20 and 30. Some of the constituent elements included in the semiconductor device 1' are substantially the same as those of the semiconductor device 1 of FIG. 1. The same constituent elements are denoted by the same reference numerals and will not be re-described below. The following description will focus on the differences between the semiconductor device 1 of FIG. 1 and the semiconductor device 1' of FIG. 6.

As shown in FIG. 6, one of the two reflectors 12 of semiconductor device 1 of FIG. 1 is replaced in semiconductor device 1' with a second reflector 12'. Thus, in the embodiment of FIG. 6 the first reflector 12 is inclined by a first angle $\theta r1$ from the plane defined by the bottom surface of the waveguide 11, that is, the bottom surface of the lower cladding layer 113, and the second reflector 12' may be inclined by a third angle $\theta r2$ from the plane defined by the bottom surface of the waveguide 11. Here, the first angle $\theta r1$ may range from about 40 degrees to about 42 degrees and the third angle $\theta r2$ may be about 45 degrees. Also, the first reflector 12 has the curved reflective surface 121 whereas the second reflector 12' may have a flat reflective surface 121'.

Accordingly, while an optical signal that passes between the optical input/output element 222 included in the first semiconductor chip 22a and the first reflector 12 may be transmitted at the second angle $\theta g$, that is, the optical input/output angle, from the perpendicular direction (i.e., a direction perpendicular to a major surface of the PCB 10'), an optical signal that passes between the optical input/output element 222 included in the second semiconductor chip 22b and the second reflector 12' may be transmitted in the perpendicular direction (i.e., may be transmitted at an angle that is substantially perpendicular to the PCB 10'). Although not shown in FIG. 6, in this case, an optical system such as, for example, a lens, may be additionally disposed between the optical input/output element 222 included in the second semiconductor chip 22b and the second reflector 12'.

As such, the semiconductor device 1' may transmit/receive an optical signal in the perpendicular direction for one of the first and second packages 20 and 30 disposed on the PCB 10', and may transmit/receive an optical signal at the optical input/output angle, that is, the second angle $\theta g$ from the perpendicular direction for the other of the first and second semiconductor packages 20 and 30.

Figure 7:
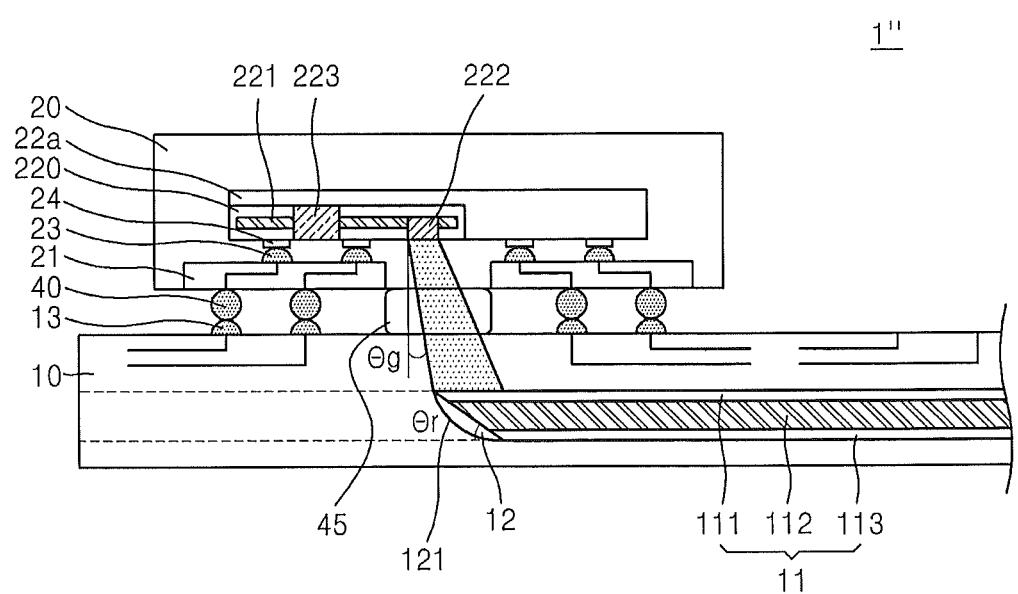
FIG. 7 is a cross-sectional view illustrating another modified example of the semiconductor device of FIG. 1.

FIG. 7 is a cross-sectional view illustrating another modified example of the semiconductor device 1 of FIG. 1.

Referring to FIG. 7, a semiconductor device 1" may include the PCB 10 and the first semiconductor package 20. Constituent elements included in the semiconductor device 1" are substantially the same as those of the semiconductor device 1 of FIG. 1, and thus, a detailed description thereof will not be given.

The semiconductor device 1" may include the PCB 10 and the first semiconductor package 20 disposed on the PCB 10. An optical signal that passes between the waveguide 11 that is embedded in the PCB 10 and the optical input/output element 222 that is included in the first semiconductor package 20 may be transmitted at the optical input/output angle, that is, the second angle $\theta g$ from the perpendicular direction. An optical signal transmitted from the optical input/output element 222 to the waveguide 11 may be transmitted to another optical element in the PCB 10. Next, the optical signal may be transmitted to another semiconductor package (not shown) that is mounted on the PCB 10. Alternatively, the optical signal may be transmitted to another input/output device (not shown) that is connected to the PCB 10.

Figure 8:
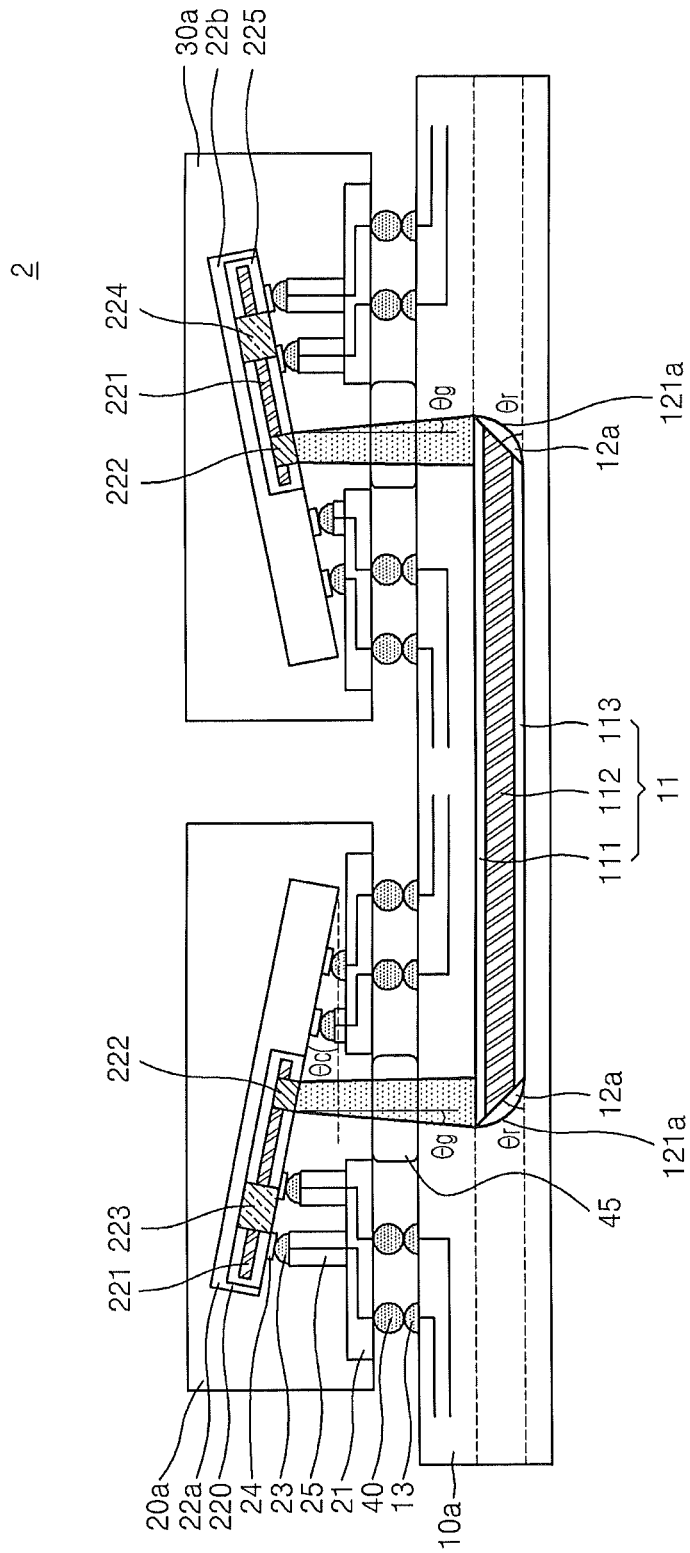
FIG. 8 is a cross-sectional view illustrating a semiconductor device according to another embodiment of the inventive concept.
Figure 9:
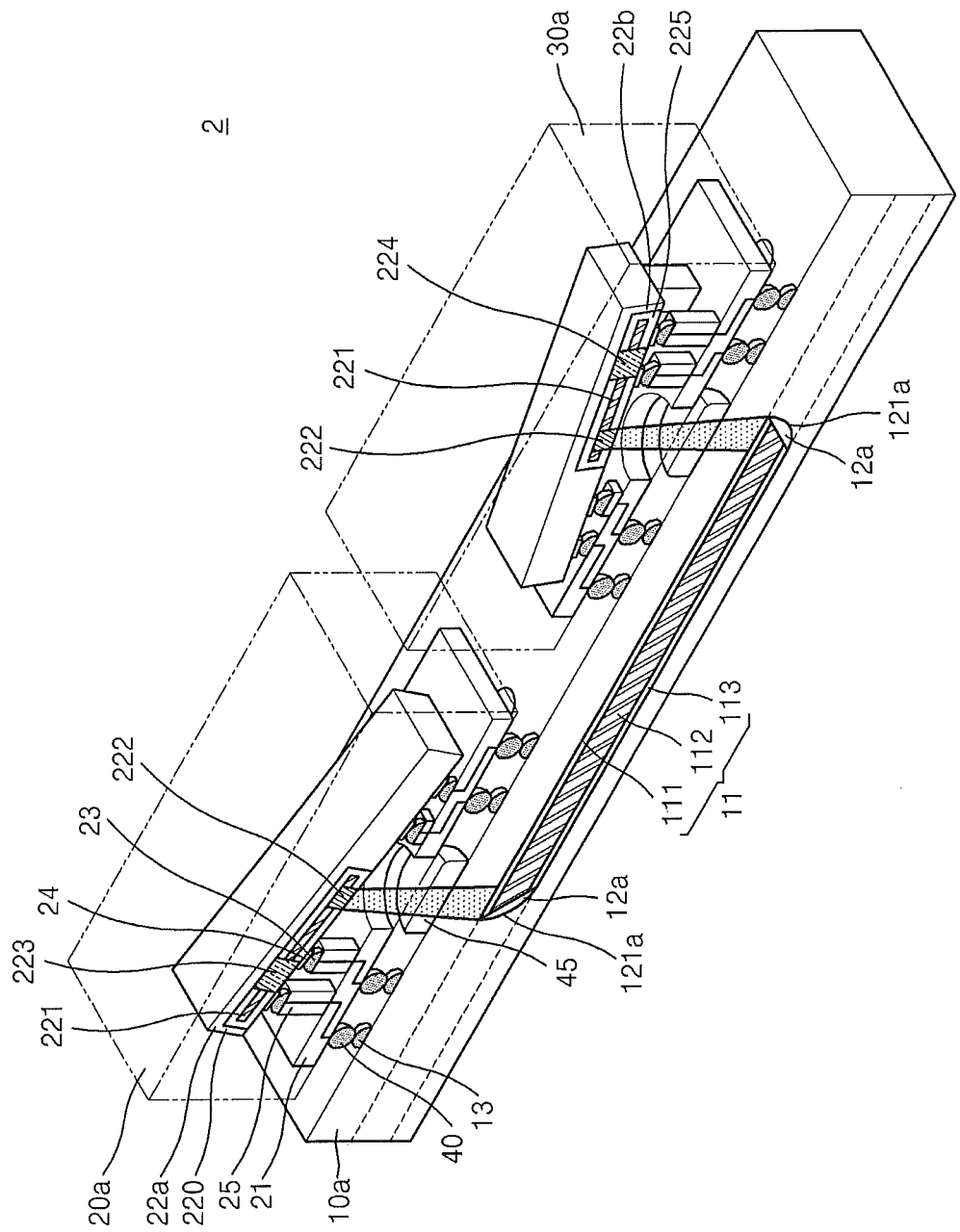
FIG. 9 is a perspective view of the semiconductor device of FIG. 8.

FIG. 8 is a cross-sectional view illustrating a semiconductor device 2 according to another embodiment of the inventive concept. FIG. 9 is a perspective view of the semiconductor device 2 of FIG. 8.

Referring to FIGS. 8 and 9, the semiconductor device 2 may include a PCB 10a, and a plurality of semiconductor packages, for example, first and second semiconductor packages 20a and 30a, disposed on the PCB 10a. Some of the constituent elements included in the semiconductor device 2 of FIG. 8 are substantially the same as those of the semiconductor device 1 of FIG. 1. The same constituent elements are denoted by the same reference numerals and will not be re-described here. The following description will focus on the differences between the semiconductor device 1 of FIG. 1 and the semiconductor device 2 of FIG. 8.

The PCB 10a may include the waveguide 11 that is embedded in the PCB 10a, and first and second reflectors 12a that are disposed at the respective ends of the waveguide 11. The first and second reflectors 12a may reflect an optical signal that is transmitted through the waveguide 11. Each reflector 12a may be inclined by the first angle $\theta r$ from the plane defined by the bottom surface of the waveguide 11. In the present embodiment, the first angle $\theta r$ may be about 45 degrees. As such, a process of forming the first and second reflectors 12a on the respective ends of the waveguide 11 when the first angle $\theta r$ is about 45 degrees may be easier than the case where the first angle $\theta r$ is not about 45 degrees, that is, when the first angle $\theta r$ is 40 degrees or 50 degrees, thereby facilitating mass production.

Each reflector 12a has a curved reflective surface 121a, and an optical signal transmitted from the waveguide 11 may be collected on the reflective surface 121a. Next, the optical signal collected on the reflective surface 121a may be transmitted to the grating coupler 222a with a width suitable for the size L1 of the grating coupler 222a. Hence, optical coupling efficiency between the waveguide 11 and the grating coupler 222a may be improved. In this case, since an optical system for coupling the grating coupler 222a and the waveguide 11 is not required to be additionally provided, costs may be reduced and mass production may be facilitated.

Each of the first and second semiconductor packages 20a and 30a may be inclined by a fourth angle θc with respect to a plane defined by the bottom surface of the package substrate 21. The first semiconductor package 20a may include the package substrate 21, the semiconductor chip 22a, the plurality of connection elements 23, the plurality of connection pads 24, and a plurality of bumps 25, and the second semiconductor package 30a may include the package substrate 21, the semiconductor chip 22b, the plurality of connection elements 23, the plurality of connection pads 24, and the plurality of bumps 25. As such, the first and second semiconductor packages 20a and 30a may have substantially the same constituent elements, except the semiconductor chips 22a and 22b may be different semiconductor chip types.

As noted above, each of the first and second semiconductor packages 20a and 30a may further include the plurality of bumps 25. The plurality of bumps 25 may be disposed on the package substrate 21, and the plurality of connection elements 23 may be disposed on the plurality of bumps 25. The plurality of connection pads 24 may be disposed on the bottom surfaces of the semiconductor chips 22a and 22b, and the semiconductor chips 22a and 22b may be electrically connected to the package substrate 21 by connecting the plurality of connection pads 24 to the plurality of connection elements 23.

The plurality of bumps 25 may have different heights. In particular, as shown in FIGS. 8 and 9, the plurality of bumps 25 may have heights which gradually increase in one direction. As such, each of the semiconductor chips 22a and 22b may be inclined by the fourth angle θc with respect to the plane defined by the bottom surface of the package substrate 21. In this case, the fourth angle θc may be determined by considering the size L1 of the optical input/output element 222, the size L2 of the waveguide 11, and a distance between the optical input/output element 222 and the waveguide 11. For example, in some embodiments, the fourth angle θc may range from about 6 degrees to about 10 degrees.

Although each of the first and second semiconductor packages 20a and 30a includes the plurality of bumps 25, the present embodiment is not limited thereto, and a different conductive material may be used to accommodate a height difference between the package substrate 21 and the plurality of connection elements 23.

As described above, according to the present embodiment, while maintaining an arrangement angle, the first angle θr, of the reflector 12a at about 45 degrees from the plane defined by the bottom surface of the waveguide 11, the semiconductor chips 22a and 22b may be inclined by the fourth angle θc with respect to the plane defined by the bottom surface of the package substrate 21 by using the plurality of bumps 25 having different heights. Accordingly, an optical signal that is transmitted through the waveguide 11 may be reflected in a direction that is perpendicular to the bottom surface of the waveguide 11. However, as the optical input/output element 222 is inclined by the fourth angle θc with respect to the plane defined by the bottom surface of the package substrate 21, the optical signal transmitted from the reflector 12a may enter the optical input/output element 222 at an angle of about 6 degrees to about 10 degrees with respect to a line that is normal to a bottom surface of the optical input/output element 222. Similarly, an optical signal output from the optical input/output element 222 may be transmitted at an inclination of about 6 degrees to about 10 degrees from the perpendicular direction (i.e., the direction perpendicular to a major surface of the PCB 10a). However, as the optical input/output element 222 is inclined by the fourth angle θc (e.g., at an inclination of about 6 degrees to about 10 degrees from the perpendicular direction), the optical signal may be transmitted to the reflector 12a in the perpendicular direction.

Figure 10:
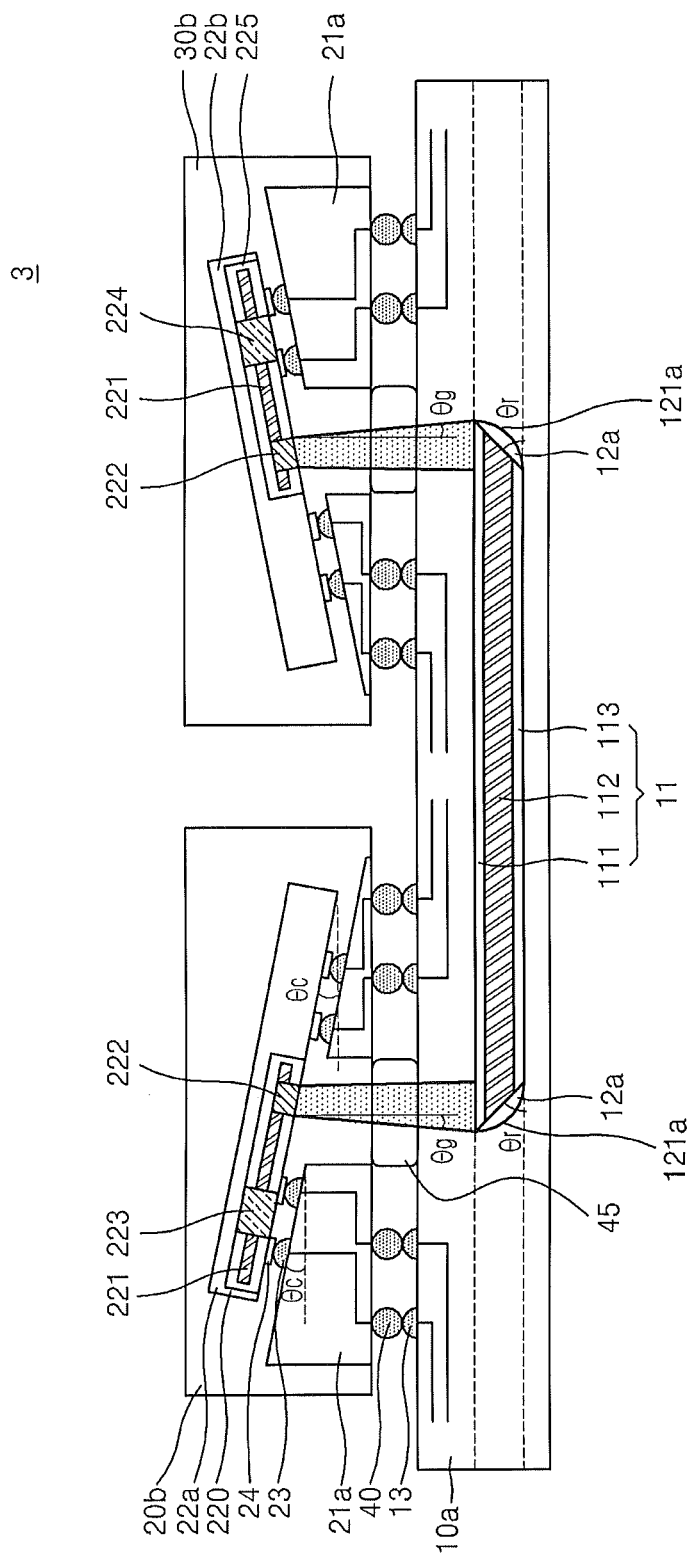
FIG. 10 is a cross-sectional view illustrating a semiconductor device according to another embodiment of the inventive concept.
Figure 11:
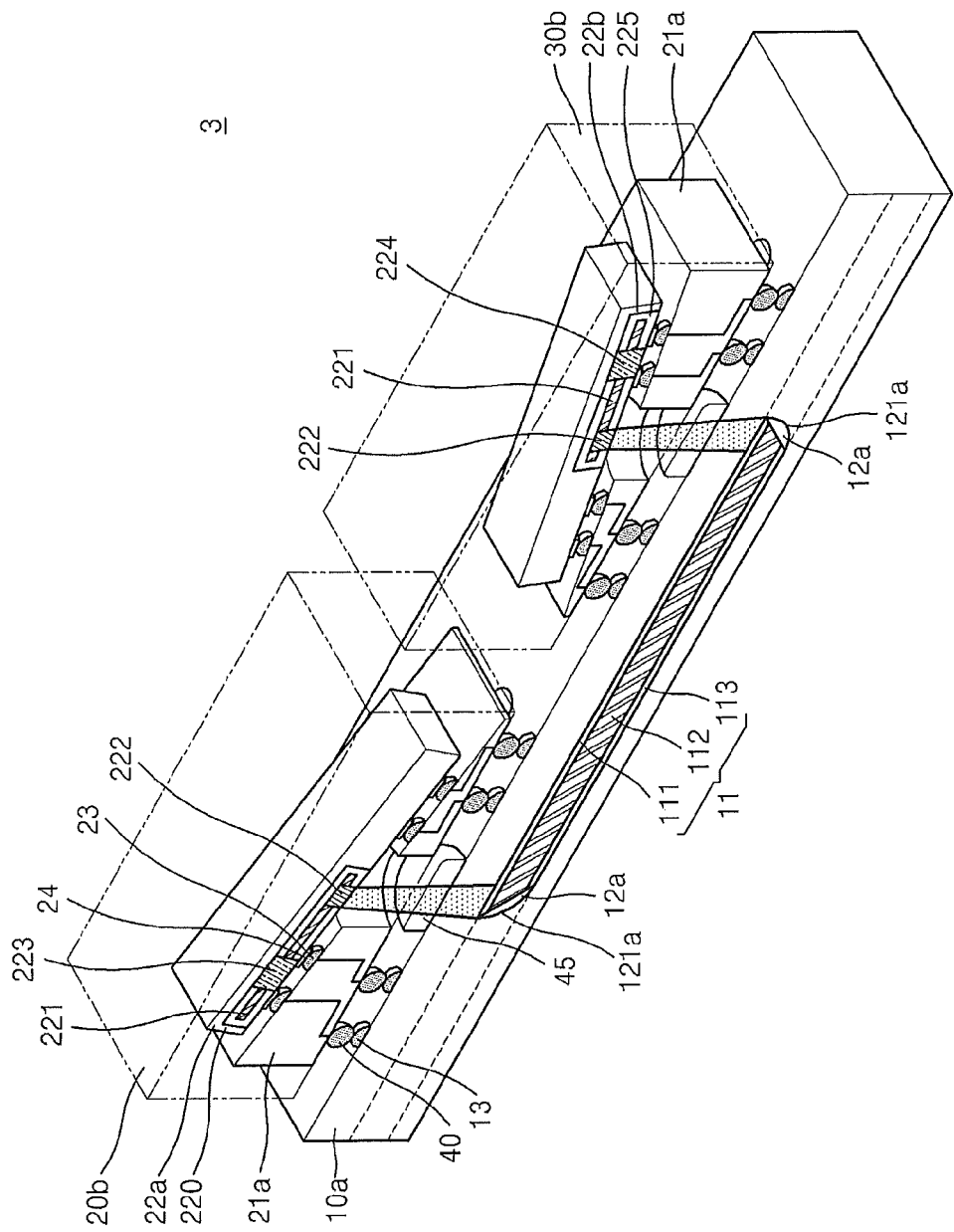
FIG. 11 is a perspective view of the semiconductor device of FIG. 10.

FIG. 10 is a cross-sectional view illustrating a semiconductor device 3 according to yet another embodiment of the inventive concept. FIG. 11 is a perspective view of the semiconductor device 3 of FIG. 10.

Referring to FIGS. 10 and 11, the semiconductor device 3 may include the PCB 10a, and a plurality of semiconductor packages, for example, first and second semiconductor packages 20b and 30b, disposed on the PCB 10a. Some of the constituent elements included in the semiconductor device 3 are substantially the same as those of the semiconductor device 2 of FIG. 8. The same constituent elements are denoted by the same reference numerals and will not be re-described here. The following description will focus on the differences between the semiconductor device 2 of FIG. 8 and the semiconductor device 3.

The first and second semiconductor packages 20b and 30b may be inclined by the fourth angle θc with respect to the plane defined by the bottom surface of the package substrate 21. The first semiconductor package 20b may include a package substrate 21a, the semiconductor chip 22a, the plurality of connection elements 23, and the plurality of connection pads 24, and the second semiconductor package 30b may include the package substrate 21a, the semiconductor chip 22b, the plurality of connection elements 23, and the plurality of connection pads 24. As such, the first and second semiconductor packages 20b and 30b may have substantially the same constituent elements except the semiconductor chips 22a and 22b may be different types of semiconductor chips (although they need not be different types).

The package substrates 21a that are included in each of the first and second semiconductor packages 20b and 30b may each have a bottom surface that is flat and a top surface that is inclined in one direction. In detail, the top surface of the package substrate 21a may be inclined by the fourth angle θc from the plane defined by the bottom surface thereof. Accordingly, each of the semiconductor chips 22a and 22b may be inclined by the fourth angle θc with respect to the bottom surface of the package substrate 21a. For example, the fourth angle θc may range from about 6 degrees to about 10 degrees.

Since each of the first and second semiconductor packages 20b and 30b does not include the plurality of bumps 25 but includes the package substrate 21a having the top surface that is inclined in one direction, each of the semiconductor chips 22a and 22b may be inclined by the fourth angle θc with respect to the bottom surface of its respective package substrate 21a.

As described above, according to the present embodiment, while maintaining an arrangement angle, that is, the first angle θr, of the reflector 12a at about 45 degrees from the perpendicular direction, the package substrate 21a may have a bottom surface that is flat and a top surface that is inclined at the fourth angle θc from the bottom surface. Accordingly, an optical signal that is transmitted through the waveguide 11 may be reflected by the reflector 12a in a direction that is perpendicular to the bottom surface of the waveguide 11. However, as the optical input/output element 222 is inclined by the fourth angle θc with respect to the plane defined by the bottom surface of the package substrate 21a, the optical signal transmitted from the reflector 12a may enter the optical input/output element 222 at an angle of about 6 degrees to about 10 degrees with respect to a bottom surface of the optical input/output element 222. Similarly, an optical signal output from the optical input/output element 222 may be transmitted at an inclination of about 6 degrees to about 10 degrees from the perpendicular direction (i.e., the direction perpendicular to a major surface of the PCB 10a). However, as the optical input/output element 222 is inclined by the fourth angle θc (e.g., at an inclination of about 6 degrees to about 10 degrees from the perpendicular direction), the optical signal may be transmitted to the reflector 12a in the perpendicular direction.

Figure 12:
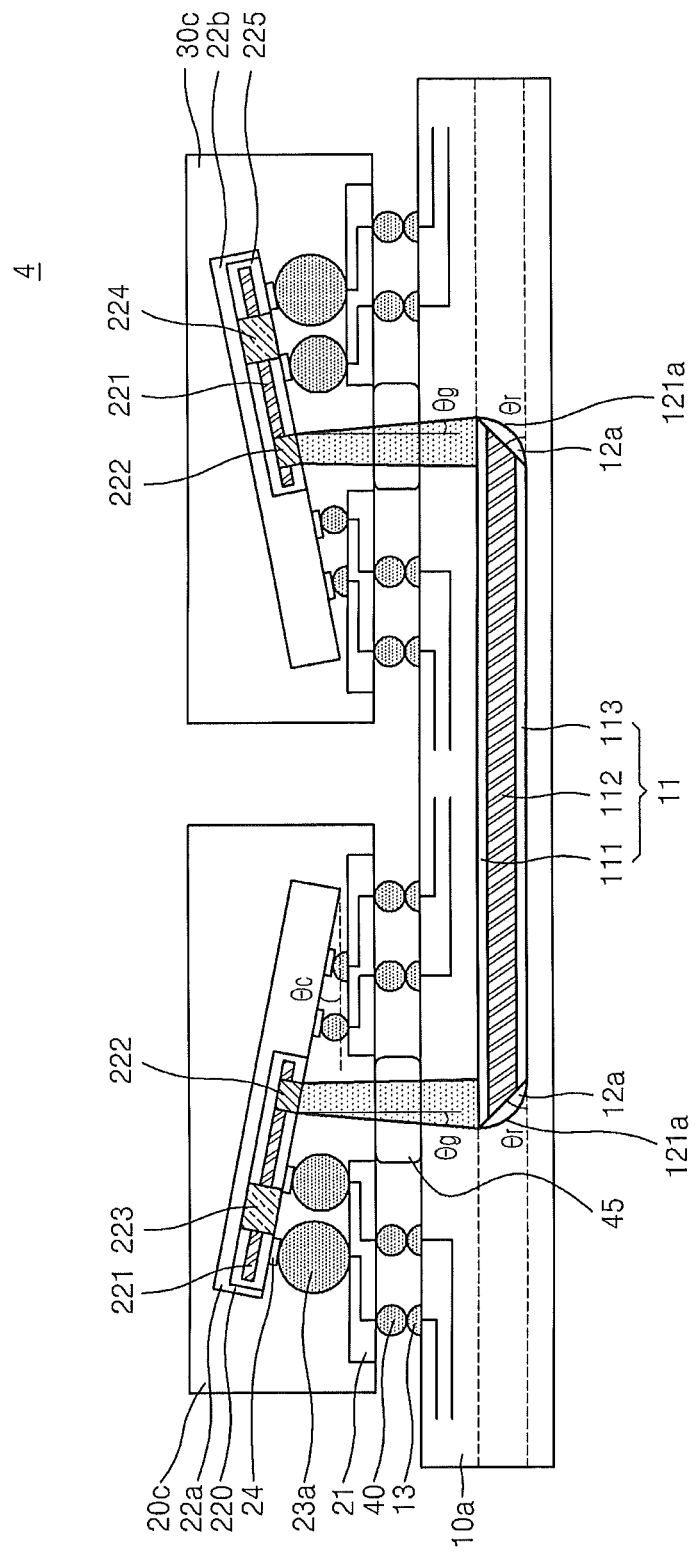
FIG. 12 is a cross-sectional view illustrating a semiconductor device according to another embodiment of the inventive concept.
Figure 13:
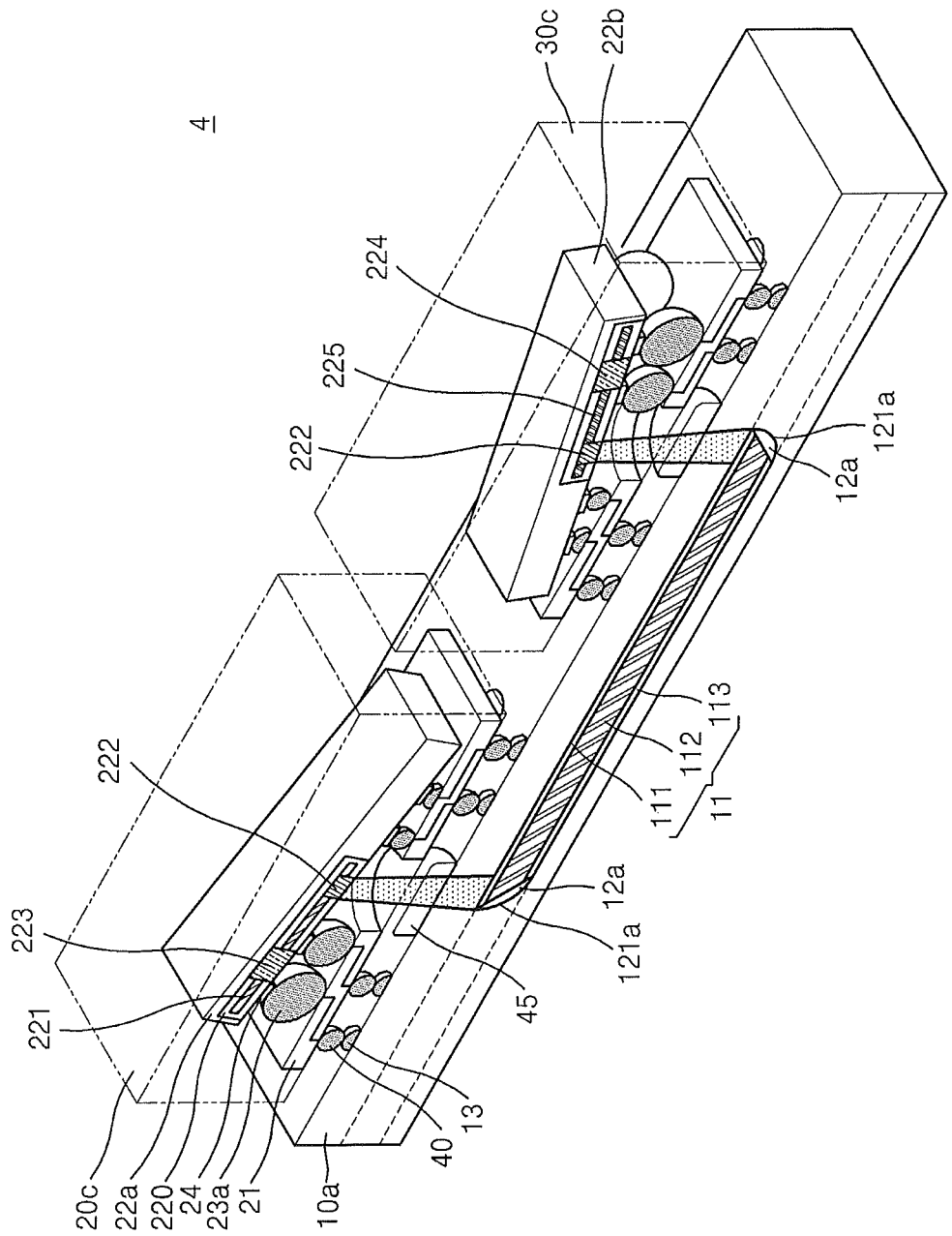
FIG. 13 is a perspective view of the semiconductor device of FIG. 12.

FIG. 12 is a cross-sectional view illustrating a semiconductor device 4 according to still another embodiment of the inventive concept. FIG. 13 is a perspective view of the semiconductor device 4 of FIG. 12.

Referring to FIGS. 12 and 13, the semiconductor device 4 may include the PCB 10a and a plurality of semiconductor packages, for example, first and second semiconductor packages 20c and 30c, disposed on the PCB 10a. Some of the constituent elements included in the semiconductor device 4 of FIG. 12 are substantially the same as those of the semiconductor device 2 of FIG. 8 and will not be re-described here. The following description will focus on the differences between the semiconductor device 2 of FIG. 8 and the semiconductor device 4 of FIG. 12.

Each of the first and second semiconductor packages 20c and 30c may be inclined by the fourth angle θc with respect to the plane defined by the bottom surface of the package substrate 21. The first semiconductor package 20c may include the package substrate 21, the semiconductor chip 22a, a plurality of connection elements 23a, and the plurality of connection pads 24, and the second semiconductor package 30c may include the package substrate 21, the semiconductor chip 22b, the plurality of connection elements 23a, and the plurality of connection pads 24. As such, the first and second semiconductor packages 20c and 30c may have substantially the same constituent elements except the semiconductor chips 22a and 22b may be of different types.

The plurality of connection elements 23a included in each of the first and second semiconductor packages 20c and 30c may have different sizes. In detail, the plurality of connection elements 23a may have sizes which increase in one direction. Accordingly, each of the semiconductor chips 22a and 22b may be inclined by the fourth angle θc with respect to the plane defined by the bottom surface of the package substrate 21. For example, the fourth angle θc may range from about 6 degrees to about 10 degrees.

In detail, the plurality of connection elements 23a may include solder balls. In this case, ball sizes of the solder balls may be different and may increase in one direction. However, the present embodiment is not limited thereto, and the plurality of connection elements 23a may include a conductive material forming a height difference between the package substrate 21 and the plurality of connection pads 24.

As described above, while maintaining an arrangement angle, that is, the first angle θr, of the reflector 12a at about 45 degrees, the semiconductor chips 22a and 22b may be inclined by the fourth angle θc with respect to the bottom surface of the package substrate 21 by using the plurality of connection elements 23a having different sizes. Accordingly, an optical signal that is transmitted through the waveguide 11 may be reflected by the reflector 12a in a direction that is perpendicular to the bottom surface of the waveguide 11. However, as the optical input/output element 222 is inclined by the fourth angle θc with respect to the plane defined by the bottom surface of the package substrate 21, the optical signal transmitted from the reflector 12a may enter the optical input/output element 222 at an angle of about 6 degrees to about 10 degrees with respect to a bottom surface of the optical input/output element 222. Similarly, an optical signal output from the optical input/output element 222 may be transmitted at an inclination of about 6 degrees to about 10 degrees from the perpendicular direction (i.e., the direction perpendicular to a major surface of the PCB 10a). However, as the optical input/output element 222 is inclined by the fourth angle θc (e.g., at an inclination of about 6 degrees to about 10 degrees from the perpendicular direction), the optical signal may be transmitted to the reflector 12a in the perpendicular direction.

Figure 14:
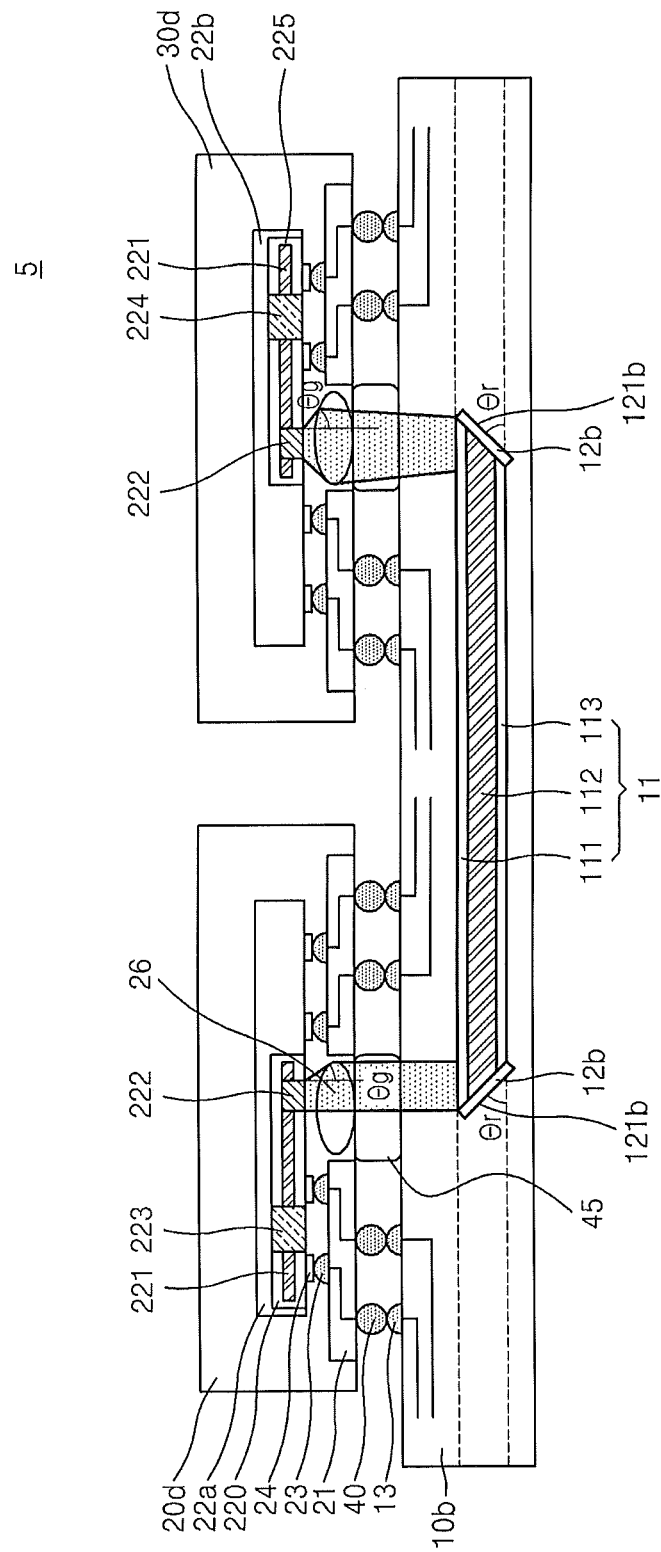
FIG. 14 is a cross-sectional view illustrating a semiconductor device according to another embodiment of the inventive concept.
Figure 15:
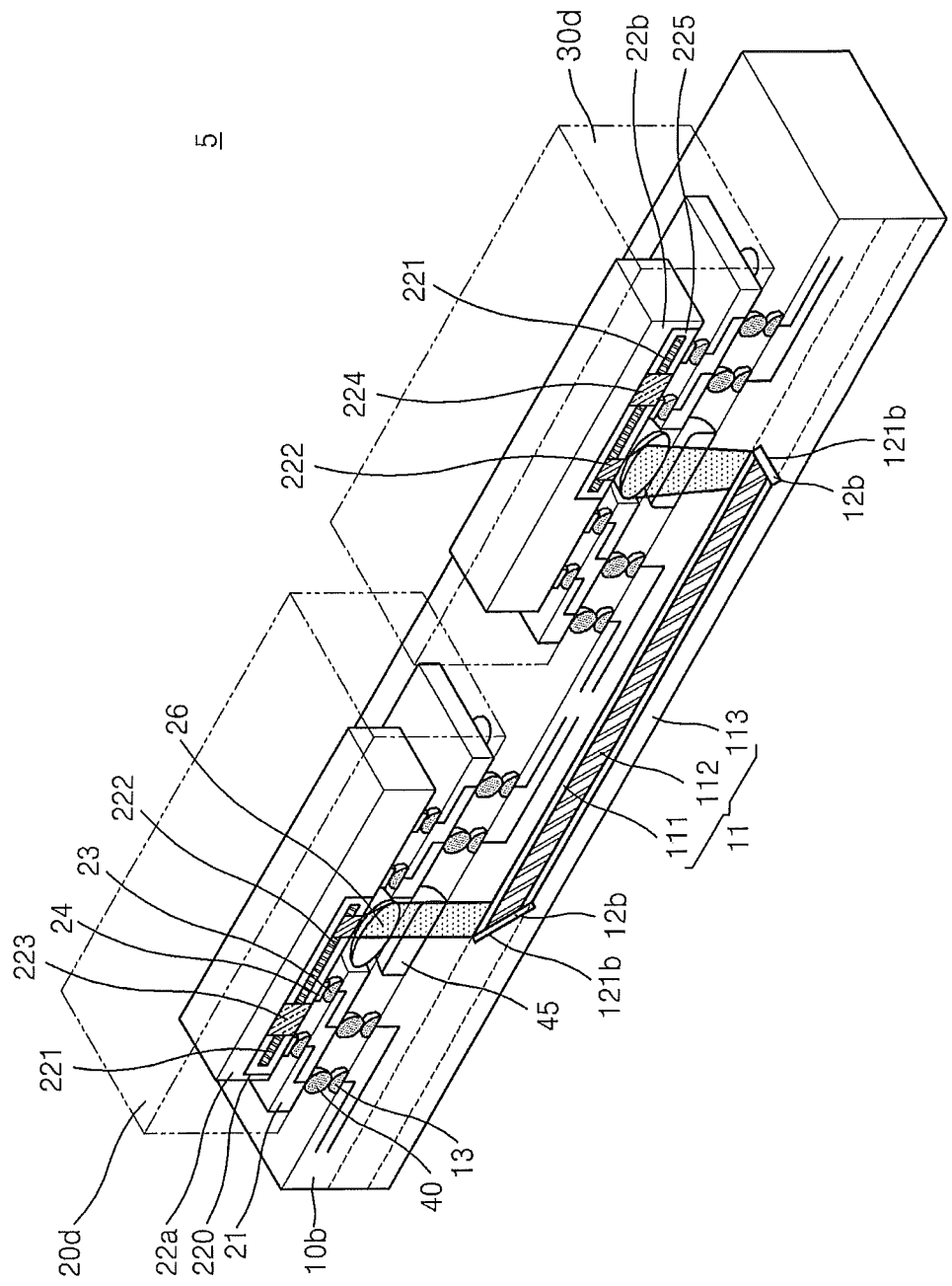
FIG. 15 is a perspective view of the semiconductor device of FIG. 14.

FIG. 14 is a cross-sectional view illustrating a semiconductor device 5 according to another embodiment of the inventive concept. FIG. 15 is a perspective view of the semiconductor device 5 of FIG. 14.

Referring to FIGS. 14 and 15, the semiconductor device 5 may include a PCB 10b and a plurality of semiconductor packages, for example, first and second semiconductor packages 20d and 30d, disposed on the PCB 10b. Some of the constituent elements included in the semiconductor device 5 of FIG. 14 are substantially the same as those of the semiconductor device 1 of FIG. 1. The same constituent elements are denoted by the same reference numerals and will not be re-described here. The following description will focus on the differences between the semiconductor device 1 of FIG. 1 and the semiconductor device 5 of FIG. 14.

The PCB 10b may include the waveguide 11 that is embedded in the PCB 10b and a pair of reflectors 12b. The reflectors 12b may be disposed on either ends of the waveguide 11 and may reflect an optical signal transmitted through the waveguide 11. The reflectors 12b may each be inclined by the first angle θr from the plane defined by the bottom surface of the waveguide 11, that is, the bottom surface of the lower cladding layer 113. In the present embodiment, the first angle θr may be about 45 degrees. Also, the reflectors 12b may each have a flat reflective surface 121b.

The first semiconductor package 20d may include the package substrate 21, the semiconductor chip 22a, the plurality of connection elements 23, the plurality of connection pads 24, and a first micro-lens 26, and the second semiconductor package 30d may include the package substrate 21, the semiconductor chip 22b, the plurality of connection elements 23, the plurality of connection pads 24, and a second micro-lens 26. As such, the first and second semiconductor packages 20d and 30d may have substantially the same constituent elements except the semiconductor chips 22a and 22b may be different types of semiconductor chips.

Unlike the semiconductor device 1 of FIG. 1, each of the first and second semiconductor packages 20d and 30d may further include the micro-lens 26. The micro-lens 26 may collect an optical signal transmitted through the waveguide 11, and transmit the collected optical signal having a width suitable for the size L1 of the optical input/output element 222 to the optical input/output element 222. Also, the micro-lens 26 may collect an optical signal output from the optical input/output element 222 and transmit the optical signal having a width suitable for the size L2 of the waveguide 11 to the waveguide 11.

Also, the micro-lens 26 may be disposed in the opening H1, and a position of the micro-lens 26 in the opening H1 may be adjusted according to a desired optical input/output angle of the optical input/output element 222. In detail, the micro-lens 26 may be disposed in the opening H1 such that an optical signal transmitted to the reflector 12b through the optical input/output element 222 passes through an edge of the micro-lens 26, that is, in an off-axis manner. This is because light incident on portions other than the center of the micro-lens 26 is focused on the center due to refraction.

Accordingly, an optical signal that is transmitted through the waveguide 11 may be reflected by the reflector 12b in a direction that is perpendicular to the bottom surface of the waveguide 11. As the light passes through the micro-lens 26 in an off-axis manner, the light is refracted such that it is transmitted at an angle of about 6 degrees to about 10 degrees with respect to a line that is normal to a bottom surface of the optical input/output element 222. Similarly, an optical signal output from the optical input/output element 222 may be transmitted at an angle of about 6 degrees to about 10 degrees from the perpendicular direction, but may then be inclined by an angle of about 6 degrees to about 10 degrees as it passes through the micro-lens 26 such that the transmitted light may exit the micro-lens 26 in the perpendicular direction so that the light is received at the reflector 12b in the perpendicular direction.

Figure 16:
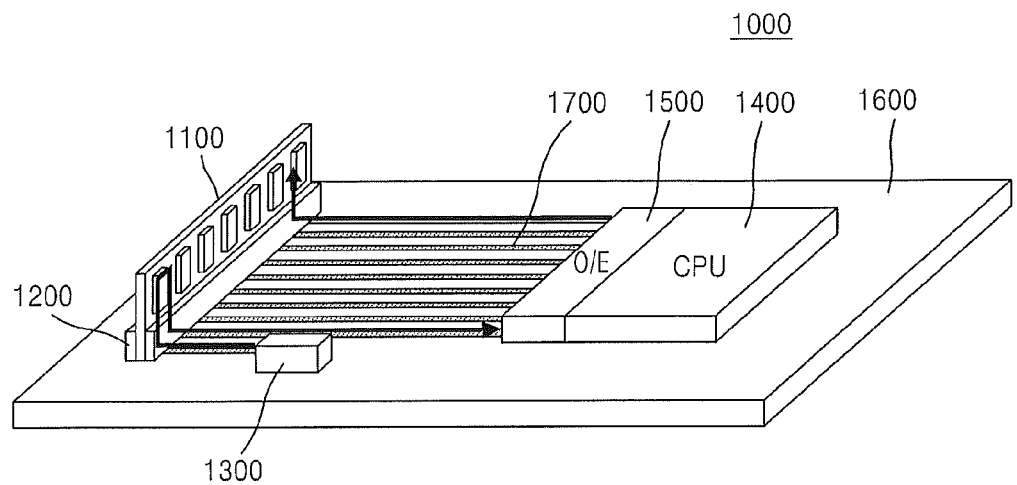
FIG. 16 is a perspective view illustrating an electronic device that includes a semiconductor device according to an embodiment of the inventive concept.

FIG. 16 is a perspective view illustrating an electronic device 1000 that includes a semiconductor device according to an embodiment of the inventive concept.

Referring to FIG. 16, the electronic device 1000 may include a memory module 1100, a light source 1300, a CPU 1400, an optoelectronic converter 1500, and a system board 1600. Here, the memory module 1100 or the CPU 1400 may include a semiconductor package or a semiconductor device according to any of the previous embodiments.

The memory module 1100 may include a semiconductor package or a semiconductor device according to any of the previous embodiments. Accordingly, the memory module 1100 may include an optical input/output device for transmitting an optical signal, that is, the optical input/output element 222 and the waveguides 11 and 221. An optical input/output angle when the optical input/output element 222 is used may range from about 6 degrees to about 10 degrees. The memory module 1100 is coupled to the system board 1600 through a socket 1200 that is formed on the system board 1600.

The light source 1300, which is an optical element such as a laser diode (LD), generates collimated light and applies the collimated light to the memory module 1100. The CPU 1400 includes an arithmetic/logic unit and a control unit to process data or control each element of the electric-electronic device 10. Although the CPU 1400 is used, a microprocessor used in a small computer, a mobile device, and so on may allow the CPU 1400 to be housed therein and may be used.

The optoelectronic converter 1500 may convert an optical signal transmitted from the memory module 1100 into an electrical signal and transmit the electrical signal to the CPU 1400, and convert an electrical signal output from the CPU 1400 into an optical signal and transmit the optical signal to the memory module 1100. While an optical signal may be generated by the optoelectronic converter 1500 and directly transmitted to the memory module 1100, light is generated by the light source 1300, a corresponding signal is added to the light to obtain an optical signal, and the optical signal is transmitted to the memory module 1100 in general.

Constituent elements, that is, the memory module 1100, the light source 1300, the CPU 1400, and the optoelectronic converter 1500, are mounted on the system board 1600. One or more optical waveguides 1700 for transmitting an optical signal may be disposed between the memory module 1100 and the optoelectronic converter 1500.

Since an optical input/output device and an optical path, that is, a waveguide, for transmitting an optical signal are formed in the memory module 1100, and the optoelectronic converter 1500 for converting an optical signal into an electrical signal and an electrical signal into an optical signal is provided on a front end of the CPU 1400, the electronic device 1000 may perform data processing and control at high speed by using an optical signal.

Figure 17:
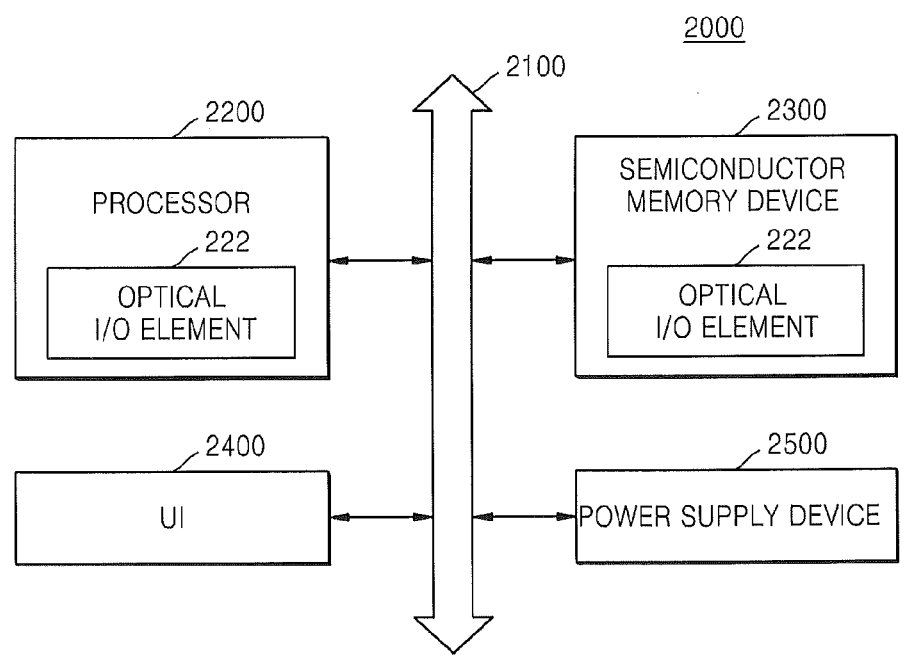
FIG. 17 is a block diagram illustrating a computer system that includes a semiconductor device according to an embodiment of the inventive concept.

FIG. 17 is a block diagram illustrating a computer system 2000 including a semiconductor device, according to an embodiment of the inventive concept.

Referring to FIG. 17, the computer system 2000 may include a processor 2200, a semiconductor memory device 2300, a user interface (UI) 2400, and a power supply device 2500. The processor 2200, the semiconductor memory device 2300, the UI 2400, and the power supply device 2500 may exchange data with one another via an optical bus 2100. Here, the processor 2200 or the semiconductor memory device 2300 may include a semiconductor package or a semiconductor device according to any of the previous embodiments.

In detail, the processor 2200 may control data to be written to and read from the semiconductor memory device 2300, and may include the optical input/output device 222. In this case, an optical input/output angle of the optical input/output device 222 may range from about 6 degrees to about 10 degrees. The semiconductor memory device 2300 may include a plurality of memory cells to store code and data for operating the processor 2200, and may include the optical input/output device 222. In this case, the optical input/output angle of the optical input/output device 222 may range from about 6 degrees to about 10 degrees.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a package substrate;
   a plurality of connection elements that are disposed on the package substrate; and
   a semiconductor chip that is electrically connected to the package substrate through the plurality of connection elements, the semiconductor chip including an optical waveguide and at least one optical input/output element that is configured to pass an optical signal between the semiconductor chip and an element external to the package substrate at an optical input/output angle that is substantially different from a direction perpendicular to a bottom surface of the package substrate.

2. The semiconductor package of claim 1, wherein a bottom surface of the semiconductor chip is inclined by the optical input/output angle with respect to the bottom surface of the package substrate.

3. The semiconductor package of claim 1, wherein the plurality of connection elements have different heights.

4. The semiconductor package of claim 3, wherein the heights of the plurality of connection elements gradually increase in one direction.

5. The semiconductor package of claim 1, wherein the plurality of connection elements comprise at least one of bumps having different heights and solder balls having different sizes.

6. The semiconductor package of claim 1, wherein a top surface of the package substrate is inclined by the optical input/output angle with respect to the bottom surface of the package substrate.

7. The semiconductor package of claim 1, further comprising a micro-lens that is disposed under the at least one optical input/output element, wherein the micro-lens is configured to adjust the optical input/output angle.

8. The semiconductor package of claim 1, wherein the optical input/output angle is between about 6 degrees and about 10 degrees from a direction perpendicular to a bottom surface of the package substrate.

9. The semiconductor package of claim 1, wherein the at least one optical input/output element comprises a grating coupler.

10. A semiconductor device comprising:
a printed circuit board (PCB) that comprises an optical waveguide and a reflector connected to one end of the optical waveguide, the reflector having a curved reflective surface; and
a semiconductor package that is disposed on a surface of the PCB and comprises a semiconductor chip that includes at least one optical input/output element that is configured to transmit an optical signal to the optical waveguide or receive an optical signal from the optical waveguide at an optical input/output angle with respect to a direction perpendicular to the surface of the PCB.

11. The semiconductor device of claim 10, wherein the reflector is inclined by an angle ranging from about 40 degrees to about 42 degrees from a bottom surface of the optical waveguide.

12. The semiconductor device of claim 10, wherein the reflector is inclined by an angle of about 45 degrees with respect to a bottom surface of the optical waveguide.

13. The semiconductor device of claim 10, wherein the semiconductor chip is inclined by the optical input/output angle with respect to a major surface of the PCB.

14. The semiconductor device of claim 10, wherein the semiconductor package further comprises a micro-lens that is disposed under the at least one optical input/output element and adjusts the optical input/output angle.

15. The semiconductor device of claim 10, wherein the at least one optical input/output element comprises a grating coupler.

16. A semiconductor device comprising:
a printed circuit board that comprises a first optical waveguide and a reflector connected to one end of the optical waveguide; and
a semiconductor package that includes a semiconductor chip that has a second optical waveguide and an optical input/output element that is configured to be in optical communication with the first optical waveguide, wherein the optical input/output element is configured to transmit light at an optical input/output angle that is inclined with respect to a direction that is perpendicular to a bottom surface of the semiconductor chip.

17. The semiconductor device of claim 16, wherein the optical input/output element comprises a grating coupler.

18. The semiconductor device of claim 16, wherein the bottom surface of the first optical waveguide defines a first plane and a bottom surface of the semiconductor chip defines a second plane that is parallel to the first plane.

19. The semiconductor device of claim 17, wherein the bottom surface of the first optical waveguide defines a first plane and a bottom surface of the semiconductor chip defines a second plane that is inclined between about 6 degrees and about 10 degrees with respect to the first plane.

20. The semiconductor device of claim 16, wherein the bottom surface of the first optical waveguide defines a first plane and a bottom surface of the semiconductor chip defines a second plane that is parallel to the first plane, and wherein an optical focusing element is interposed in the optical transmission path between the first optical waveguide and the optical input/output element such that an optical signal passing from the optical input/output element to the first optical waveguide passes through the optical focusing element in an off-axis manner.

* * * * *